United States Patent [19]

Fukaya et al.

[11] 4,287,390
[45] Sep. 1, 1981

[54] POWER AMPLIFIER APPARATUS HAVING OVER-CURRENT PROTECTION FUNCTION

[75] Inventors: Hirokazu Fukaya; Masashi Shoji, both of Tokyo, Japan

[73] Assignee: Nippon Electric Co., Ltd., Tokyo, Japan

[21] Appl. No.: 44,136

[22] Filed: May 31, 1979

[30] Foreign Application Priority Data

May 31, 1978 [JP] Japan .................... 53-66042

[51] Int. Cl.³ .................... H03F 21/00; H03F 3/18
[52] U.S. Cl. .................... 179/1 A; 330/207 P; 330/298
[58] Field of Search .................... 330/298, 207 P, 267, 330/273; 179/1 A, 1 F

[56] References Cited

U.S. PATENT DOCUMENTS

| | | | |
|---|---|---|---|
| 3,376,388 | 4/1968 | Reiffin | 179/1 A |
| 3,448,395 | 6/1969 | Webb | 330/298 |
| 3,486,124 | 12/1969 | Eisenberg | 330/298 |
| 3,988,693 | 10/1976 | Seki | 330/298 |

Primary Examiner—Thomas A. Robinson
Attorney, Agent, or Firm—Sughrue, Rothwell, Mion, Zinn and Macpeak

[57] ABSTRACT

A power amplifier having first and second amplifiers each including an output stage consisting of series connections of collector-emitter paths of first and second output transistors connected between power supply terminals is disclosed. Each first and second transistor is driven alternately in response to an input signal fed through an input terminal, and each output transistor is provided with an over-current detector circuit. Protective circuits are responsive to the detection outputs of the detector circuits to protect the corresponding output transistors. The output terminals of the power amplifier are respectively connected to the common junction of the first and second output transistors of the first and second amplifiers, and a load such as a speaker is connected between the output terminals. Circuits are provided to apply the outputs of the over-current detector circuits in one amplifier to the corresponding protective circuits in the other amplifier, and vice versa.

13 Claims, 3 Drawing Figures

POWER AMPLIFIER APPARATUS HAVING OVER-CURRENT PROTECTION FUNCTION

BACKGROUND OF THE INVENTION

The present invention relates to a power amplifier apparatus having an over-current protecting function for protecting a load or output transistor from being destroyed by an excessive output current, and more particularly to improvements in effective protection for a load and output transistor in an power amplifier apparatus in which a load is connected between output terminals of two power amplifiers for complementarily effecting amplification of a signal.

A so-called BTL (Balanced Transformerless) system has been known, as disclosed in, for example, FIG. 7 of U.S. Pat. No. 3,376,388, in which a pair of direct-coupled power amplifiers of an OTL (output transformerless) system are used and operated so as to respond to one input signal for respectively producing outputs of opposite phases, and the outputs are fed to a load connected between output terminals of the pair of power amplifiers. In such a power amplifier apparatus of the BTL system, if an output terminal of one power amplifier should contact with one end of a power supply to form a short-circuit therebetween, an infinite current would flow through one of output transistors of the power amplifier, and thus the output transistors would be immediately destroyed. The conventional OTL power amplifier normally has a circuit part for protecting the output transistors from being destroyed by an excessive current. The circuit part detects the excessive current of an emitter current in the output transistors and then limits an increase of the base currents of the output transistors so as to suppress the increase in the emitter current or to decrease the emitter current, and hence the above-mentioned breakdown of the output transistors does not occur. However, in the BTL system, since the power amplifier on the side of the un-short-circuited output is operating normally, a large D.C. current flows constantly through a speaker connected to the power amplifier as a load, and consequently, the voice coil of the speaker would be burnt out. If a D.C. blocking capacitor is inserted between an output terminal of the power amplifier and the speaker, then the burning of the voice coil caused by the aforementioned D.C. current will not occur. However, a large value of electric charge is stored in the D.C. blocking capacitor upon output short-circuiting. Therefore, when the output short-circuiting has been released, the stored charge will discharge through the voice coil, and burn it.

SUMMARY OF THE INVENTION

It is a major object of the present invention to provide a power amplifier of the BTL system having a protecting function such that a load and output transistors may be effectively protected when one output is short-circuited to one end of a power supply.

According to one feature of the present invention, there is provided a power amplifier apparatus comprising first and second amplifiers each constructed as a single-ended push-pull circuit and including two output transistors series-connected between the power supply terminals, detector circuits for detecting an over-current flowing through the output transistors, protective circuits responsive to detection outputs from the detector circuits for inhibiting an increase of the current flowing through the output transistors, and output means for deriving an output from the singled-ended push-pull circuit, the first and second amplifiers being so constructed that they respond to the input signals having opposite phases to each other and deliver outputs of different phases respectively from their output means, a load connected between the output means of the first and second amplifiers, and means for applying detection outputs of the over-current detector circuits in one amplifier to the corresponding protective circuits in the other amplifier and vice versa.

According to the present invention as featured above, even when an over-current flows through one output transistor in one amplifier, the corresponding output transistors in both of the amplifiers can be protected by the detection output from one of the detector circuits which is operating. Consequently, an increase of a potential difference between the output terminals of the respective amplifiers can be suppressed, and hence a current flowing through a load would not be unnecessarily increased. Therefore, in the case where a speaker or the like is connected as a load to the power amplifier according to the present invention, the voice coil of the speaker would not be burnt out. In addition, when a load is connected to output terminals through a coupling capacitor, the load is also protected from burn out. Since, even if an output terminal is short-circuited to a power supply, the charge stored in the capacitor is limited to a small value, discharge current from the capacitor is a small value. Therefore, when the short-circuiting is released, a large current would not flow through a load and thus the load can be protected from burn-out.

BRIEF DESCRIPTION OF THE DRAWINGS

The above and other features of the invention will become more apparent from the following description taken in conjunction with the accompanying drawings, wherein.

DESCRIPTION OF THE PRIOR ART

Figure 1:
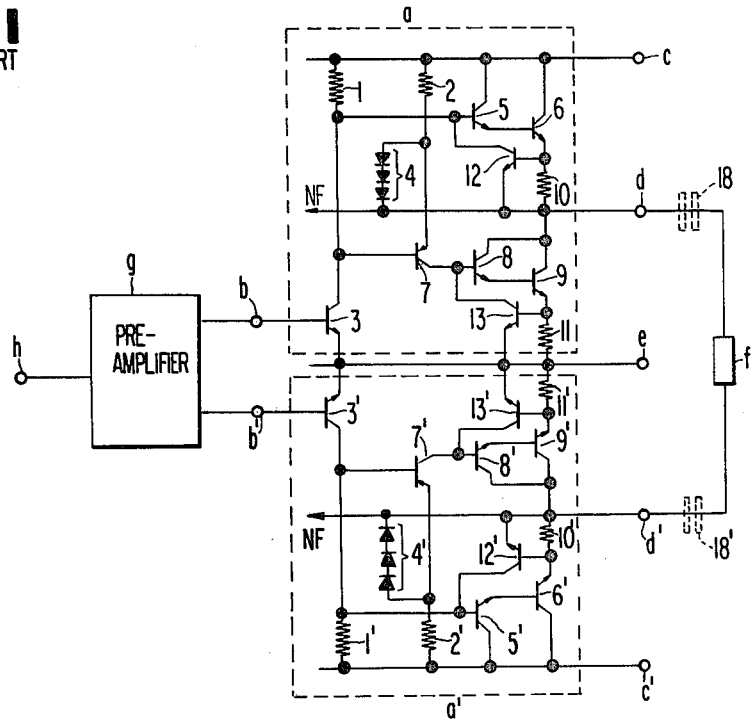
FIG. 1 is a circuit diagram showing a power amplifier apparatus in the prior art.

A power amplifier apparatus of the BTL system in the prior art is, as shown in FIG. 1, constructed of a pair of power amplifiers a and a' each being a single-ended push-pull circuit, that is, a single-ended push-pull circuit a connected between a power supply terminal c and a ground terminal e and composed of a driving transistor 3, a composite NPN transistor consisting of transistors 5 and 6 and a composite PNP transistor consisting of transistors 7, 8 and 9, and a similarly composed circuit a' connected between a power supply terminal c' and ground terminal e. Generally, the two power supply terminals c and c' are connected to the same power supply and held at the same voltage. Input signals applied to the preamplifier g through the input terminal h are processed to derive two outputs having opposite phases to each other. These outputs are supplied through the terminals b and b' to the driving transistors 3 and 3', respectively, and thereafter at output terminals d and d', respectively, through composite transistors connected so as to have a high current amplification factor, that is, composite NPN transistors consisting of transistors 5 and 6 and transistors 5' and 6', respectively, and composite PNP transistors consisting of transistors 7, 8 and 9 and transistors 7', 8' and 9', respectively. By operating the pair of power amplifiers a and a' in a BTL mode, input signals having the same amplitude and opposite phases are applied to the input terminals b and b', and after the input signals have been amplified by the pair of power amplifiers a and a', output signals having the same amplitude and opposite phase are obtained at the output terminals d and d' and thereby a load f connected between the output terminals d and d' can be driven. It is to be noted that reference numerals 4 and 4' respectively designate diodes for bias voltage setting and temperature compensation, and that the output signals at the output terminals d and d' are fed back respectively to preceding stages to form a feed-back loop (NF).

Resistors 10, 11 and 10', 11' and transistors 12, 13 and 12', 13' form protective circuits for limiting excessive currents through the output transistors 6, 9 and 6', 9', respectively, to prevent these output transistors from being destroyed by the excessive currents. These protective circuits are so constructed and so operated that resistors 10, 11 and 10', 11' having a low resistance are connected in emitter circuits of the respective output transistors 6, 9 and 6', 9', respectively; potential drops produced by currents flowing through these low resistance resistors 10, 11 and 10', 11' are detected by means of transistors 12, 13 and 12', 13', which transistors become conducting when the current flowing through the corresponding output transistors are excessive currents and limit the driving currents for the corresponding output transistors by by-passing a part of the driving current, and thereby excessive currents through the output transistors are limited to prevent their breakdown. It is to be noted that the value of the excessive current flowing through the output transistor when the protective circuit operates is larger than the value of the current flowing upon normal operation of the power amplifier, and the critical value is present at such current value that the protective circuit may not operate under a normal operating condition. Therefore, the protective circuit is effective to limit excessive currents flowing through the output transistors 6, 9 and 6', 9' and to prevent breakdown thereof under an abnormal condition as in the case where the output terminal d or d' is accidentally connected to one end of power supplies c, c' or e or upon over-loading (when the impedance of the load f is too low).

However, in the heretofore known power amplifier apparatus which employs a pair of power amplifiers, each having the aforementioned protective circuit, with a load connected between output terminals of the respective power amplifier to perform BTL operations, when an output terminal of one power amplifier is accidentally connected to one end of a power supply, although prevention of breakdown of the output transistors can be achieved in the power amplifier having the aforementioned output terminal, the load is apt to be damaged or destroyed. In more detail, the output terminal of the other power amplifier is connected through a load to the aforementioned output terminal and to the aforementioned one end of the power supply, so that the load is driven by a predetermined D.C. output voltage at the output terminal of said the other power amplifier as superposed with an output signal derived by amplifying an input signal applied to the input terminal of the other power amplifier. When no input signal exists, the D.C. output voltage at the output terminal is generally designed to a value equal to one-half of the power supply voltage. Therefore, the mean current flowing through a speaker of the load is determined by the load impedance and one-half of the power supply voltage. This results in a D.C. excessive current flowing through a voice coil of the speaker and often in the burning out of the voice coil.

Describing now the case where the output terminal d of one power amplifier a has been short-circuited to the ground terminal e, since an excessive current flows through the output transistor 6 to the ground terminal e via the power supply terminal c, the collector of the transistor, the emitter thereof, and the low resistance resistor 10, the transistor 12 becomes conducting and causes an increase of the current flowing through the output transistor 6 to be suppressed, and thereby breakdown of the output transistor 6 can be prevented. However, a D.C. current determined by the D.C. output voltage at the output terminal d' of the other power amplifier a' and the impedance of the load f, would constantly flow from the power supply terminal c' through the collector-emitter path of the output transistor 6', the low resistance resistor 10', the output terminal d' and the load f to the ground terminal e which is then short-circuited to the output terminal d.

The value of the aforementioned D.C. current is not substantially larger than the peak value of the A.C. current flowing through the output transistor 6' at the normal operating state (substantially equal to or sometimes slightly larger than the latter), and therefore, the transistor 12' would not become conducting due to the potential drop appearing across the low resistance resistor 10', so that the aforementioned D.C. current flowing through the output transistor 6' continues to flow through the load f so long as the output terminal d is short-circuited to the ground terminal e, and this causes the voice coil of the speaker to be burnt out. While description has been made above with respect to the case where the output terminal d is short-circuited to the ground terminal e, likewise in the case where the output terminal d' is short-circuited to the ground terminal e and in the case where the output terminal d or d' is short-circuited to the power supply terminal c or c', respectively, also a similar D.C. current would flow through the voice coil of the speaker and would cause the voice coil to be burnt out.

In addition, in the case where the load is connected to the output terminals via D.C. blocking capacitors (18, and 18'), if one of the output terminals makes contact with the ground terminal e or the power supply terminals c or c', the D.C. blocking capacitor will be charged up to a voltage equal to one-half of the power supply voltage. This is higher than the charged voltage when any output terminal is not short-circuited to the ground terminal e or power supply terminal c or c'. In this case, when the short-circuit of output terminal is opened, the charge stored in the blocking capacitor will be discharged through the load f and output transistors, which sometimes results in burn-out of the load f or breakdown of the output transistors.

DESCRIPTION OF THE PREFERRED EMBODIMENTS

Now the present invention will be described in greater detail in connection to its preferred embodiments illustrated in FIGS. 2 and 3.

Figure 2:
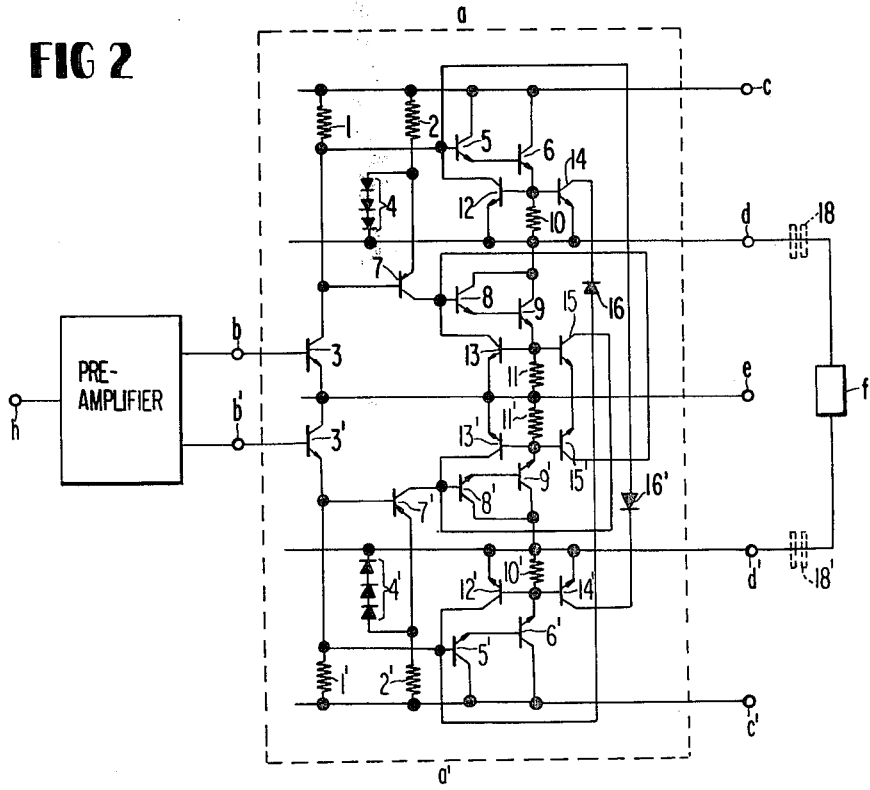
FIG. 2 is a circuit diagram showing a preferred embodiment of the present invention.

A first preferred embodiment of the power amplifier apparatus according to the present invention is illustrated in FIG. 2, in which component parts equivalent to those in the power amplifier apparatus in the prior art (see FIG. 1) are given like reference numerals, and the difference between this preferred embodiment and the prior art apparatus is that base-emitter paths of transistors 14, 14' and 15, 15' are connected across the low resistance resistors 10, 10' and 11, 11', respectively, the collectors of the transistors 14 and 14' are connected via diodes 16 and 16' to the bases of the transistors 5' and 5, respectively, while the collectors of the transistors 15 and 15' are directly connected to the bases of the transistors 8' and 8, respectively. The diodes 16 and 16' are inserted so as to be inversely biased at normal operation.

In this embodiment, when the output terminal d of one power amplifier a is short-circuited to one end of the power supply (power supply terminal c or ground terminal e), the currents flowing through the output transistor 6 or 9 of the power amplifier a is detected as potential drop across the low resistance resistor 10 or 11, the transistor 14 or 15 becomes conductive due to the detection output, the base current for the output transistor 6' or 9' of the other power amplifier a' is bypassed by way of the transistor 14 or 15, respectively, and thereby the output transistor 6' or 9' is also turned off. The connection of collectors of the transistors 14 and 15 are designed so that the transistor 14 makes the transistor 6' turn off when the transistor 12 becomes conductive and that the transistor 15 makes the transistor 9' turn off when the transistor 13 becomes conductive. Therefore, the power amplifier apparatus operates in such a manner that no output is fed to the load when the output terminal d is accidentally connected to one end of the power supply. the Similar detection transistors 14' and 15' are provided to detect excessive currents flowing through the resistors 10' and 11' and to make the output transistors 6 and 9 turn off when the output terminal d' is accidentally short-circuited to the power supply terminal c' or the ground terminal e. The diodes 16 and 16' are provided for the purpose of inhibiting inverse currents, that is, the currents flowing from the collectors of the transistors 14 and 14' towards the transistors 5 and 5', respectively.

In this way, when a protective transistor operates to limit base current to one output transistor in one amplifier, the equivalent output transistor in the other amplifier simultaneously decreases its operating current, and then the current flowing through the load f is suppressed to a small value. This results in protection of the load f from burnout due to continuous flow of a large current therethrough. Further, even if, in the case where the load f is connected to the output terminals of amplifiers through capacitors 18, 18', when the short-circuit of an output terminal is opened in order to make the protective transistor turn off and to recover normal operation of the BTL mode power amplifier, change in charged potential in the capacitors is so small that the discharge current may not burn out the load f or voice coil of a loud speaker connected as a load f. In other words, even if one of output terminals in this embodiment is accidentally short-circuited to the power supply terminal c, c' or the ground terminal e, the BTL mode power amplifier of this embodiment is protected from not only the breakdown of output transistors but also burning-out or destruction of the load.

Figure 3:
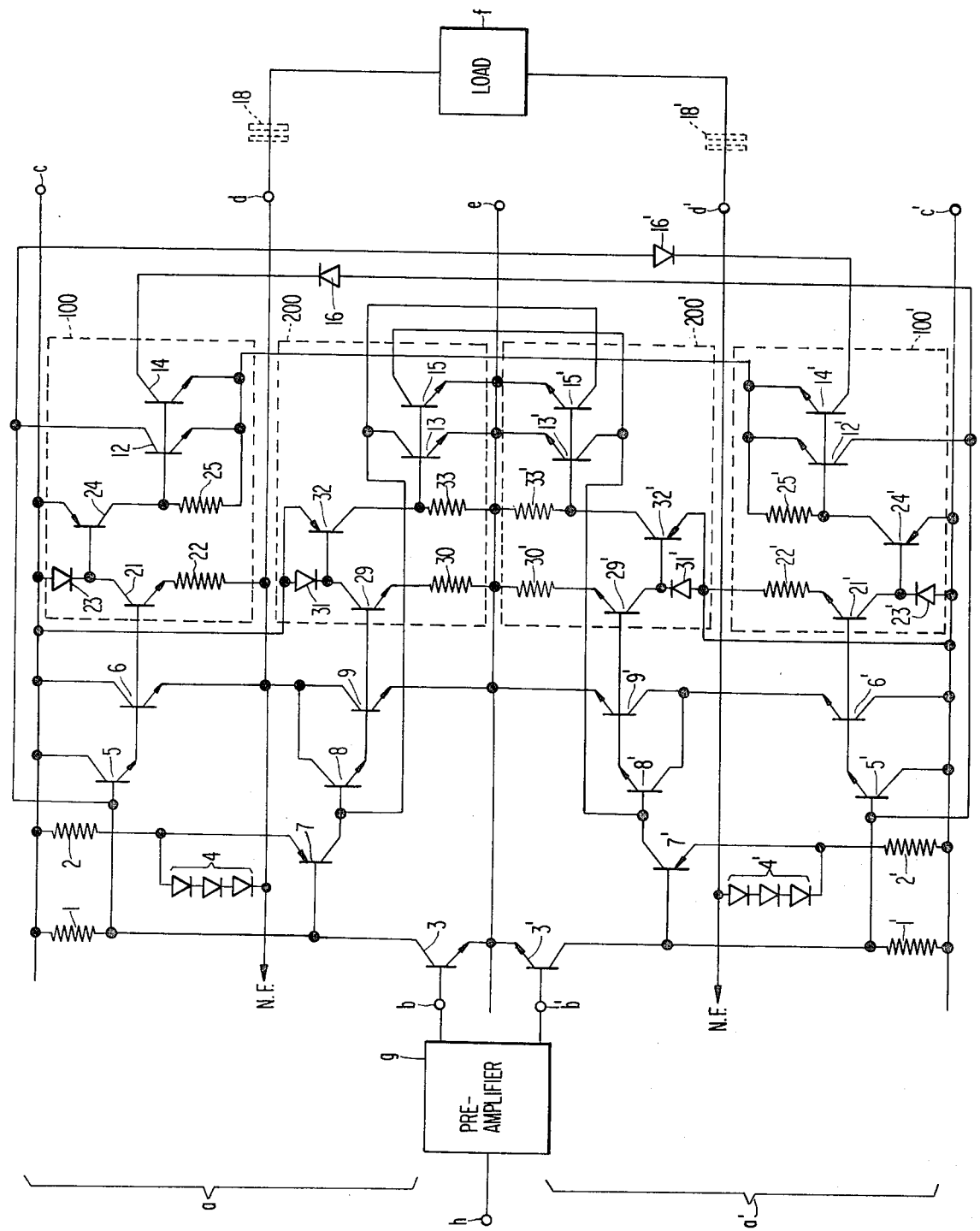
FIG. 3 is a circuit diagram showing another preferred embodiment of the present invention.

Referring to FIG. 3, it would be understood from the circuit construction that the amplifiers a and a' have the same circuit design, and thus we will explain hereinafter the amplifier a only. As same as the aforementioned embodiment shown in FIG. 2, the input signal applied to the input terminal b is amplified by the driver transistor 3, then by the single-ended push-pull output stage constructed by the transistors 5, 6, 7, 8 and 9, and derived from the output terminal d. The load f such as a loud speaker is connected between the output terminals d and d' to be driven by the potential difference between the output terminals d and d'. It is noted that the emitter electrodes of the output transistors 6 and 9 are directly connected to the output terminal d and the ground terminal e, and that the current detectors 100 and 200 are connected to the bases of the transistors 6 and 9, respectively. In the current detectors 100 and 200, the currents in proportion to the output current flowing through output transistors 6 and 9 are produced by the transistors 21, 29 and the resistors 22, 30 and fed to the resistors 25, 33 by the diodes 23, 31 and the transistors 24, 32, and then the voltage drops across the resistors 25, 33 are detected by the transistors 12, 13 and 14, 15. The outputs of the transistors 12 and 13 are fed to the bases of the transistors 5 and 8 in order to suppress the increase of output currents of the transistors 6 and 9, and the outputs of the transistors 14 and 15 to the bases of the transistors 5' and 8' in the other amplifier a' in order to suppress the increase of output currents of the transistors 6' and 9'.

In the power amplifier apparatus of the second embodiment, the collector currents of the transistors 21 and 29 are in proportion to the output currents flowing through the output transistors 6 and 9, respectively, the ratio of these currents being controlled by the base-emitter junction area of the transistors 21 and 29 and the resistances of the resistors 22 and 30. The currents having the same value as the currents flowing though the collectors of the transistors 21 and 29, respectively, flow through the resistors 25 and 33 by the intermediary of current mirror circuits consisting of the diode 23 and transistor 24 and the diode 31 and transistor 32, respectively, and the potential drops appearing across the resistors 25 and 33 are applied to the transistors 12 and 13 which serve to turn off the transistors 6 and 9, and to the transistors 14 and 15 which serve to turn off the transistors 6' and 9'. Thereby, when the output terminal d is short-circuited to one end of the power supply (the power supply terminal c or the ground terminal e), the currents flowing through the output transistors 6 and 9 become excessively large, the base-emitter forward voltages of the output transistors 6 and 9 are also increased, and as a result the voltages applied between the base and emitter of the transistors 21 and 29, respectively, are increased. The currents flowing to the collectors of these transistors 24 and 32 are also increased, so that the potential drops appearing across the resistors 25 and 33 can fully drive the transistors 12, 14 and 13, 15, respectively, resulting in turning off of the output transistors 6, 6' and 9, 9', and therefore, no output is fed to the voice coil of the speaker connected as the load f, and thus the voice coil can be protected from burn out.

In the normal operation when no output terminal is short-circuited to the power supply terminal c, c' or the ground terminal e, since no emitter resistor is inserted in the emitter circuits of the output transistors 6 and 9, full power can be supplied to the load f without any loss. It is needless to say that the current detectors 100, 100', 200 and 200' are designed to keep a cut-off condition in normal operation. Therefore the current detectors 100, 100', 200 and 200' would not affect the output signal in the normal operation.

While the current flowing through the output transistors 9' and 9 were limited by connecting the collectors of the transistors 15 and 15' to the bases of the transistors 8' and 8 in the above embodiments of FIGS. 2 and 3, it is also possible to control the current flowing through the output transistors 9' and 9 by connecting the collectors of the transistors 15 and 15' to the emitters of the transistors 7' and 7, respectively, or to the bases of the transistors 3' and 3, respectively. Moreover, while the transistors 14 and 15 and diode 16 were illustrated as a circuity for controlling the operating current of the output transistors in one power amplifier in response to detection output of an excessive current flowing through the output transistors in the other power amplifier, mechanical control switching elements such as a lead switch or a relay switch could be substituted therefor. In other words, switching elements can be easily driven with the aforementioned detection output and thereby limit the current flowing through the output transistors.

In addition, burning out of the voice coil caused by release of the short-circuiting of the output terminal to the ground terminal or to the power supply in the case where the loud speaker is connected as the load f to the output terminals via a D.C. blocking capacitor, can be equally protected according to the present invention, because the D.C. blocking capacitor would not be charged.

As described in detail above, the BTL mode power amplifier apparatus according to the present invention operates in such manner that an excessive output current of one power amplifier is detected by a detector circuit, a breaking circuit is driven by the detection output and an output current of the other power amplifier is blocked by the breaking circuit to protect a speaker from destruction, and the BTL power amplifier apparatus is especially suitable to be formed in a semiconductor integrated circuit. Moreover, according to the present invention a power amplifier apparatus that is practically very useful, can be provided.

What is claimed is:

1. A power amplifier comprising a first series connection of collector-emitter paths of first and second output transistors connected between power supply terminals; first driving means for driving said first and second output transistors alternatively in response to a first input signal fed through a first input terminal; first over-current detector means provided for said first and second output transistors; first protective means for protecting said first and second output transistors in response to the output of said first over-current detector means; a first output terminal coupled to said first series connection; a second series connection of collector-emitter paths of third and fourth output transistors connected between said power supply terminals; second driving means for driving said third and fourth output transistors alternatively in response to a second input signal fed through a second input terminal, the phase of said first input signal being opposite to that of said second input signal; second over-current detector means provided for said third and fourth output transistors; second protective means for protecting said third and fourth output transistors in response to the output of said second over-current detector means; a second output terminal coupled to said second series connection; a load coupled between said first and second output terminals; first applying means for applying the output from said first over-current detector means to said second protective means; and second applying means for applying the output from said second over-current detector means to said first protective means.

2. A power amplifier claimed in claim 1, wherein the collector-emitter paths of said first and fourth output transistors are coupled to one of said power supply terminals, and the collector-emitter paths of said second and third output transistors are coupled to the other of said power supply terminals.

3. A power amplifier claimed in claim 2, wherein said first over-current detector means includes a first resistor provided in the emitter path of said first output transistor and a second resistor provided in the emitter path of said second output transistor, and said second over-current detector means includes third and fourth resistors provided in the emitter paths of said third and fourth output transistors, respectively.

4. A power amplifier claimed in claim 1, further comprising first current-producing means for producing a current in proportion to the operating current flowing through said first and second output transistors; first current supplying means for supplying a current from said first current-producing means to said first over-current detector means; second current-producing means for producing a current in proportion to the operating current flowing through said third and fourth output transistors; and second current supplying means for supplying a current from said second current-producing means to said second over-current detector means.

5. A power amplifier claimed in claim 2, wherein said first protective means includes a fifth and sixth transistor whose emitters and bases are respectively connected across said first and second resistors and collectors are coupled to the bases of said first and second output transistors, respectively, and said second protective means includes seventh and eighth transistors whose emitters and bases are respectively connected across said third and fourth resistors and collectors are coupled to the bases of said third and fourth output transistors, respectively, and wherein said first applying means includes ninth and tenth transistors having emitters and bases respectively connected across said first and second resistors and collectors coupled to the collectors of said eighth and seventh transistors, respectively, and said second applying means includes eleventh and twelfth transistors having emitters and bases respectively connected across said third and fourth resistors and collectors connected to the collectors of said sixth and fifth transistors, respectively.

6. A power amplifier claimed in claim 4, wherein said first and second current-producing means include current mirror circuits.

7. A power amplifier claimed in claim 1, further comprising blocking capacitors connected between said load and said first and second output terminals.

8. A power amplifier claimed in claim 1, wherein said load is connected between said first and second output terminals without a capacitive element.

9. An amplifier comprising: an input terminal for receiving an input signal; means coupled to said input terminal for generating from said input signal a first and a second signal having mutually opposite phases; series-connected first and second transistors; first driving means for driving said first and second transistors alternatively in response to said first signal; series-connected third and fourth transistors; second driving means for driving said third and fourth transistors alternatively in response to said second signal; a first output terminal coupled to a junction between said first and second transistors; a second output terminal coupled to a junction between said third and fourth transistors, said first and second output terminals being adapted to have a load connected therebetween; first and second over-current detector circuits respectively coupled to said first and second output transistors; first and second protective circuits responsive to the outputs of said first and second over-current detector circuits, respectively, for protecting said first and second output transistors; third and fourth over-current detector circuits respectively coupled to said third and fourth output transistors; third and fourth protective circuits responsive to the outputs of said third and fourth over-current detector circuits, respectively, for protecting said third and fourth output transistors; means for applying an output of said first over-current detector circuit to said fourth protective circuit; means for applying an output of said second over-current detector circuit to said third protective circuit; means for applying an output of said third over-current detector circuit to said second protective circuit, and means for applying an output of said fourth over-current detector circuit to said first protective circuit.

10. A power amplifier comprising:

a first amplifier including: a first series connection of collector-emitter paths of first and second output transistors connected between first and second power supply terminals, said first and second output transistors being coupled to said first and second power supply terminals, respectively; means for driving said first and second output transistors alternatively in response to a first signal fed through a first input terminal; first and second means for producing a current in proportion to the operating current flowing through said first and second output transistors, respectively; first and second over-current detector circuits each having a resistor which generates a voltage drop across both ends due to a current from said first and second means for producing a current, respectively; first and second protective circuits provided for said first and second output transistors, respectively, and each including a first transistor having an emitter and a base connected to respective ends of said resistor in said first and second over-current detector circuits and a collector coupled to the base of the corresponding output transistor, respectively; a first output terminal coupled to said first series connection;

a second amplifier including: a second series connection of collector-emitter paths of third and fourth output transistors connected between said first and second power supply terminals, said third and fourth output transistors coupled to said second and first power supply terminals, respectively, means for driving said third and fourth output transistors alternatively in response to a second signal fed through a second input terminal; third and fourth means for producing a current in proportion to the operating current flowing through said third and fourth output transistors, respectively; third and fourth over-current detector circuits each having a resistor which generates a voltage drop across both ends due to a current from said third and fourth means for producing a current, respectively; third and fourth protective circuits provided for said third and fourth output transistors respectively, and each including a first transistor having an emitter and a base connected to respective ends of said resistor in said third and fourth over-current detector circuits and a collector coupled to the base of the corresponding output transistor; a second output terminal coupled to said second series connection;

means for obtaining said first and second signals from one input signal, the phase of said first signal being opposite to that of said second signal;

a load coupled between said first and second output terminals; and each said first, second, third and fourth protective circuits further including a second transistor having an emitter and base connected to respective ends of said resistor, the collector of said second transistor in said first protective circuit being coupled to the base of said fourth output transistor, the collector of said second transistor in said second protective circuit being coupled to the base of said third output transistor, the collector of said second transistor in said third protective circuit being coupled to the base of said second output transistor, and the collector of said second transistor in said fourth protective circuit being coupled to the base of said first output transistor.

11. A power amplifier claimed in claim 10, wherein each of said first, second, third and fourth means for producing a current includes a current mirror circuit driven by a third transistor having a common base connection with the corresponding output transistor.

12. A power amplifier claimed in claim 10, further comprising blocking capacitors connected between said load and said first and second output terminals.

13. A power amplifier claimed in claim 10, wherein said load is connected between said first and second output terminals without a capacitive element.

* * * * *

UNITED STATES PATENT AND TRADEMARK OFFICE
CERTIFICATE OF CORRECTION

PATENT NO. : 4,287,390

DATED : September 1, 1981

INVENTOR(S) : Hirokazu FUKAYA et al.

It is certified that error appears in the above—identified patent and that said Letters Patent is hereby corrected as shown below:

Column 5, line 35, delete "the" (second occurrence).

Column 8, line 32, delete "claim 2" and insert -- claim 3 -- .

Signed and Sealed this

Tenth Day of November 1981

[SEAL]

Attest:

GERALD J. MOSSINGHOFF

Attesting Officer     Commissioner of Patents and Trademarks